United States Patent
Nishikata et al.

[11] Patent Number: 5,991,473
[45] Date of Patent: Nov. 23, 1999

[54] WAVEGUIDE TYPE SEMICONDUCTOR PHOTODETECTOR

[75] Inventors: Kazuaki Nishikata; Michinori Irikawa, both of Kanagawa, Japan

[73] Assignee: The Furukawa Electric Co., Ltd., Tokyo, Japan

[21] Appl. No.: 08/890,119

[22] Filed: Jul. 9, 1997

[30] Foreign Application Priority Data

Jul. 10, 1996 [JP] Japan .................................. 8-199860
Sep. 12, 1996 [JP] Japan .................................. 8-240882

[51] Int. Cl.$^6$ ............................................ G02B 6/10
[52] U.S. Cl. ............................ 385/14; 385/131; 257/188; 257/441

[58] Field of Search ........................................ 257/184, 188, 257/189, 441, 442, 464; 385/14, 131

Primary Examiner—Rodney Bovernick
Assistant Examiner—Juliana K. Kang
Attorney, Agent, or Firm—Helfgott & Karas, P.C.

[57] ABSTRACT

A waveguide type semiconductor photodetector comprises a n-InP substrate, and a laminate including a first and second optical confinement layers and an undoped optical absorption layer interposed therebetween. The optical absorption layer has a thickness between 0.2 and 0.5 $\mu$m, and a bandgap wavelength smaller than the bandgap wavelength of the first and second optical confinement layers. The photodetector has a large mode field diameter and a small coupling loss between the same and a glass fiber.

3 Claims, 4 Drawing Sheets

WAVEGUIDE TYPE SEMICONDUCTOR PHOTODETECTOR

BACKGROUND OF THE INVENTION (a) Field of the Invention

The present invention relates to a waveguide type semiconductor photodetector and, more particular, to a wideband semiconductor photodetector having a waveguide and exhibiting a high optical sensitivity and a low output distortion.

(b) Description of the Related Art

A conventional semiconductor photodetector incorporating therein a waveguide for guiding incident light to an optical absorption layer (hereinafter called waveguide type semiconductor photodetector or simply photodetector) has a layer structure wherein p- and n-type semiconductor layers sandwich therebetween a lightly-doped optical absorption layer or core layer to form a p-n junction. This type of semiconductor photodetector is generally applied with a reverse bias voltage between the p- and n-type semiconductor layers to deplete the optical absorption layer of carriers, and takes advantage of the high electric field generated in the depleted layer in the optical absorption layer to effect a photo-electric conversion of a signal light received through the incidence facet of the waveguide. In this process, the semiconductor photodetector receives the signal light through the incidence facet to guide the same to the optical absorption layer, and detects excited carriers generated by the incident light in the depletion layer as a photo-current. The excited carriers generated and drifting in the depletion layer are separated by the high electric field in the depletion layer as separate holes and electrons. The separated electrons reach p-type cladding layer and the separated holes reach n-type cladding layer, thereby contributing the generation of the photo-current.

The waveguide type semiconductor photodetector has several advantages including selection ability by the wavelength of the signal light, a high operational speed, and a wide-band characteristic. It also has the advantage of having a profile and a structure similar to those of a semiconductor laser etc. to facilitate integration therewith.

However, it is difficult to adapt the mode field diameter of the conventional photodetector to the core diameter (or mode field diameter) of an optical fiber to be coupled with the photodetector for optical transmission, thereby raising a problem of coupling loss therebetween.

The optical adaptation in the mode field diameter between two systems, such as between the optical fiber and photodetector is discussed herein in view of the importance in reduction of the optical loss. Assuming that axial deviation between the two systems is in one direction, i.e., either horizontal or vertical direction, the coupling factor η between the two systems can be represented by the following equation:

$$\eta = 2 \cdot W_1 \cdot W_2 / \{(W_1^2 + W_2^2) \cdot \exp[-2\delta^2/(W_1^2 + W_2^2)]\} \quad (1)$$

wherein W1 and W2 represent mode field diameters of both the systems, and δ represents the deviation or offset amount between the optical axes of both the system. The equation (1) is obtained from overlapping integral of electric field in the one direction.

The coupling loss between the two systems can be calculated by the above equation (1) from a specified mode field diameter ratio (or relative mode field diameter) between the two systems: if the ratio is 2, then the calculated coupling loss is 1 dB; and if the ratio is 3, then the calculated coupling loss is 2.5 dB.

In the case where the internal quantum effect is assumed 100% and if the mode filed diameter ratio between the two systems is 2, the optical sensitivity of the photodetector for a signal light having a 1.3 μm wavelength is approximately 0.85 A/W, and if the ratio is 3 in a similar condition, the optical sensitivity is approximately 0.6 A/W.

It is to be noted the mode field diameter of the photodetector should be equal to that of the optical fiber or quartz waveguide to be coupled therewith in order to obtain a satisfactory coupling efficiency or to reduce the coupling loss. For this purpose, the optical absorption layer of the photodetector should be grown to have a sufficient thickness, for example, 4 μm or above to be adapted with the diameter of the light emitted from the optical fiber or quartz waveguide.

However, it is difficult to obtain a thickness of 4 μm or above for an optical absorption layer in a photodetector wherein the layer structures including the optical absorption layer is epitaxially grown on a substrate. Namely, the adaptation of the mode field diameter by increasing the thickness of the epitaxial optical absorption layer is not practical in the photodetector.

JP-A-4(1992)-241272 proposes a photodetector wherein the optical absorption be 0.15 μm thick to reduce the confinement efficiency thereof, thereby increasing the effective mode field diameter of the optical absorption layer. This proposal, however, has a problem in which a high electric field generated within the optical absorption layer causes a zener break-down due to a tunnel current.

SUMMARY OF THE INVENTION

It is an object of the present invention to provide a waveguide type semiconductor photodetector having a small coupling loss and a high optical sensitivity when coupled with other optical devices such as an optical fiber.

It is an additional object of the present invention to provide a waveguide type semiconductor photodetector having a large tolerance for an axial deviation between the same and optical devices to be coupled therewith.

It is another additional object of the present invention to provide a waveguide type semiconductor photodetector capable of being manufactured in a high throughput.

The present inventor have conducted various simulations and experiments to examine the relationship between the mode field diameters and the thicknesses or bandgap wavelengths of the optical absorption layer as well as the light confinement layers.

First, by changing the compositions and thicknesses of the optical absorption layer and the optical waveguide layer as parameters, the relationship between the mode field diameter of the waveguide and the thickness of the optical absorption layer in the photodetector was examined. FIG. 1 graphically shows the results thus obtained, with the abscissa and ordinate being the thickness of the optical absorption layer and mode field diameter, respectively. Curve (1) shown in the figure is obtained with the four parameters as follows: bandgap wavelengths of the optical absorption layer and each optical confinement layer at 1.35 μm and 1.25 μm, respectively, and the thicknesses of both the optical confinement layers at 2 μm and 3 μm, respectively. Similarly, curves (2) to (6) shown in the figure are obtained with the four parameters at the respective values shown in the figure.

As understood from FIG. 1, if the thickness of the optical absorption layer is reduced from 1 μm to 0.5 μm or less, the mode field diameter increase remarkably. On the other hand, the thickness of the optical absorption layer is increased from 1 $\mu$m, the curves approach to a straight line passing through the origin, i.e., the mode field diameter changes substantially in proportion to the thickness of the optical absorption layer.

Further, since the refractive index of the optical absorption layer is much larger compared with the optical confinement layer if the optical absorption layer is made of GaInAs having a bandgap wavelength of $\lambda$=1.65 $\mu$m, for example, the confinement function of the optical confinement layers is strong so that the thicknesses of the optical absorption layer is nearly equal to the mode field diameter. On the other hand, if the wavelengths of the optical absorption layer and optical confinement layer are approximately equal to each other, or the refractive indices of both the layers are approximately equal to each other, the mode field diameter increases as the thickness of the optical confinement layer increases.

In summary, to obtain a larger mode field diameter of the photodetector, the following options:

(1) to select the thickness of the optical absorption layer on the order of the desired mode field diameter; and (2) to select a larger bandgap wavelength of the optical absorption layer up to the value nearly equal to that of the optical confinement layers, i.e., to select a smaller refractive index for the optical absorption layer, a larger thickness for the optical confinement layer and a smaller thickness for the optical absorption layer below 0.5 $\mu$m may be considered.

The option (1) for selecting a larger thickness for the optical absorption layer is a known technology and has the problem as mentioned before. The present invention provides a high sensitive photodetector by selecting the option (2) to obtain a larger mode field diameter of the waveguide in the photodetector.

The present invention provides, in a first aspect thereof, a waveguide type semiconductor photodetector comprising a semiconductor substrate, and a first semiconductor layer of a first conductivity type, an undoped second semiconductor layer and a third semiconductor layer of a second conductivity type opposite to the first conductivity type which are consecutively formed on the semiconductor substrate, the second semiconductor layer having a thickness between 0.2 $\mu$m and 0.5 $\mu$m and having a bandgap energy lower than bandgap energies of the first and third semiconductor layers.

In accordance with the first aspect of the present invention, the first through third semiconductor layers function as a first optical confinement layer, an optical absorption layer and a second optical confinement layer, respectively. The photodetector having the specified configuration has a mode field diameter equal to or above 3 $\mu$m which is approximately equal to a mode field diameter of a general optical fiber to be coupled with the photodetector so that a high coupling efficiency therebetween can be obtained. In the photodetector of the present invention, a lower thickness (lower than 0.2 $\mu$m) for the second semiconductor layer must not be employed, because it results in a lower zener breakdown voltage and a lower confinement factor which causes a lower effective absorption factor.

It is preferable that the difference between the bandgap wavelength of the first and third semiconductor layers (or optical confinement layers) and the bandgap wavelength of the second semiconductor layer (or optical absorption layer) be less than 0.3 $\mu$m.

Furthermore, the optical confinement layers implemented as the first and third semiconductor layers should have a thickness not lower than 2 $\mu$m. As a result of this configuration, a larger tolerance for an axial deviation of the two mode fields can be obtained and accordingly, degradation of the photosensitivity resulting from an unavoidable axial deviation can be reduced.

FIG. 2 graphically shows the relationship between the thickness of the optical confinement layers plotted on abscissa and the maximum mode orders and mode field diameter of the photodetector both plotted on ordinate. In the figure, the values for the maximum number of mode orders and mode field diameter are obtained against the thickness of 2.5 $\mu$m for the optical confinement layer, with the thickness of the p-type and n-type confinement layers maintained at 2 $\mu$m and 3 $\mu$m, respectively.

When the thickness of the optical confinement layer exceeds 2 $\mu$m according to a preferred embodiment of the present invention, the maximum number of obtained mode orders is as high as six which provides a larger tolerance for the axial deviation between the two systems, to thereby improve the coupling efficiency.

The present invention provides, in a second aspect thereof, a waveguide type semiconductor photodetector comprising a semiconductor substrate, and a first semiconductor layer of a first conductivity type, an undoped second semiconductor layer and a third semiconductor layer of a second conductivity type opposite to the first conductivity type which are consecutively formed on the semiconductor substrate, the first semiconductor layer having a thickness between 0.05 $\mu$m and 1 $\mu$m, the third semiconductor layer having a thickness not lower than 1 $\mu$m.

In accordance with the second aspect of the present invention, the photodetector has a multiplicity of modes in the waveguide and exhibits a larger tolerance for deviation in the thickness direction of the layers. The photodetector of the second aspect preferably has a ridge structure for the layers, wherein the width of the ridge structure should be equal to or above 10 $\mu$m to maintain the horizontal tolerance within an allowable level.

The above and other objects, features and advantages of the present invention will be more apparent from the following description taken in conjunction with the attached drawings.

PREFERRED EMBODIMENTS OF THE INVENTION

Now, the present invention is more specifically described by way of preferred embodiments thereof with reference to accompanying drawings.

First Embodiment

Figure 1:
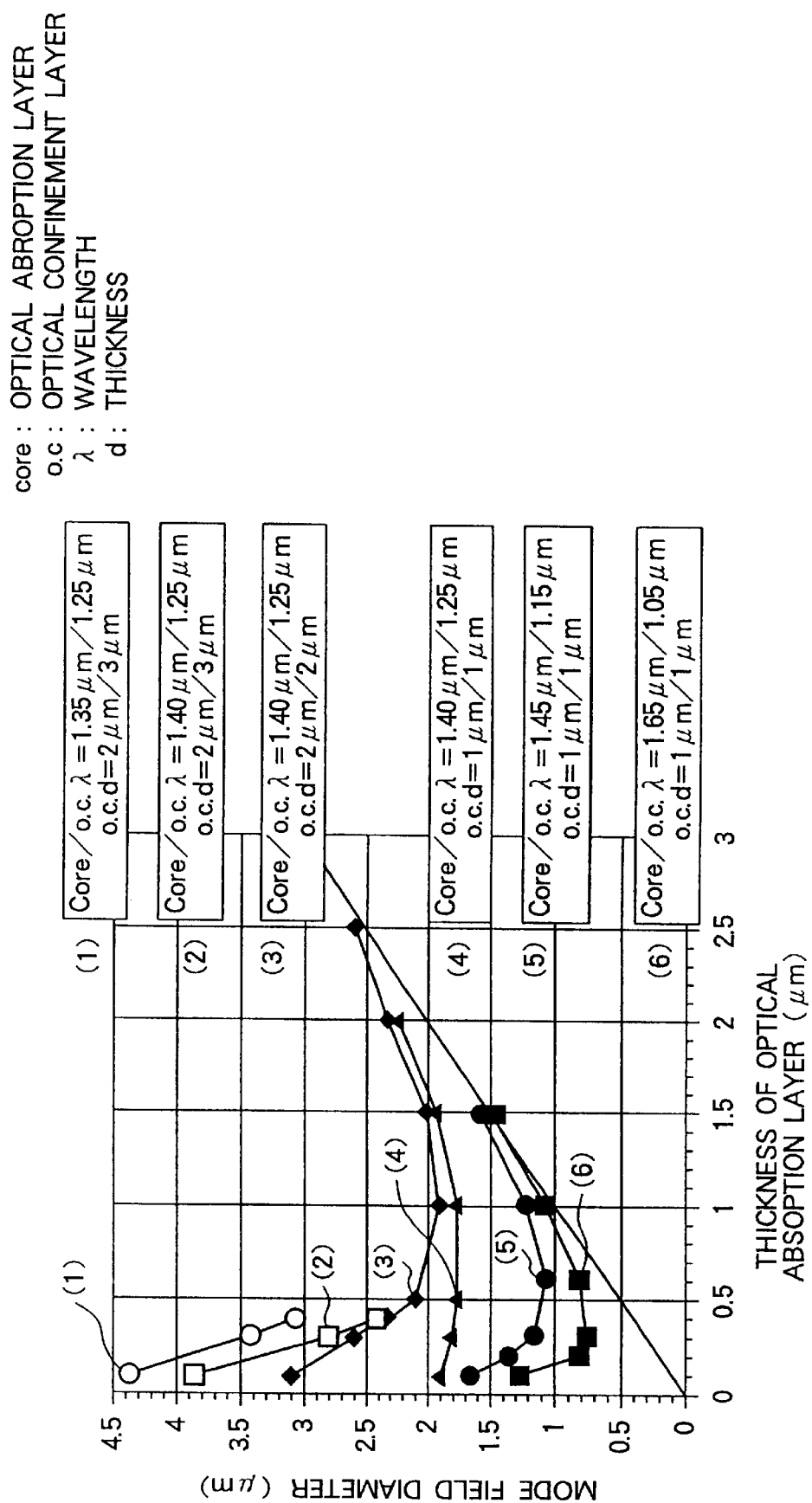
FIG. 1 graphically shows the general relationship between the thickness and mode field diameter of the optical absorption layer.
Figure 2:
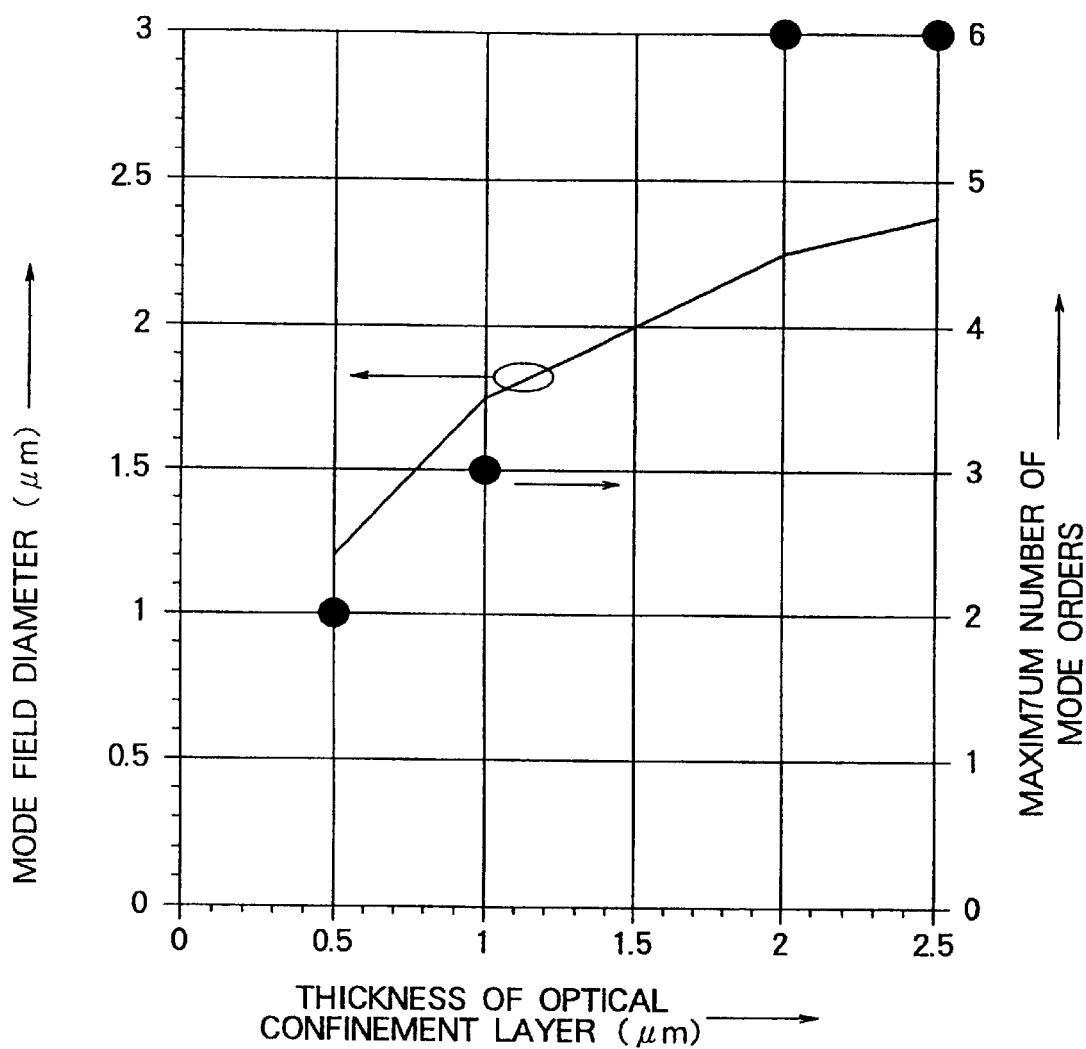
FIG. 2 graphically shows the general relationship between the thickness and the maximum number of mode orders of the mode field diameter of the optical confinement layer.
Figure 3:
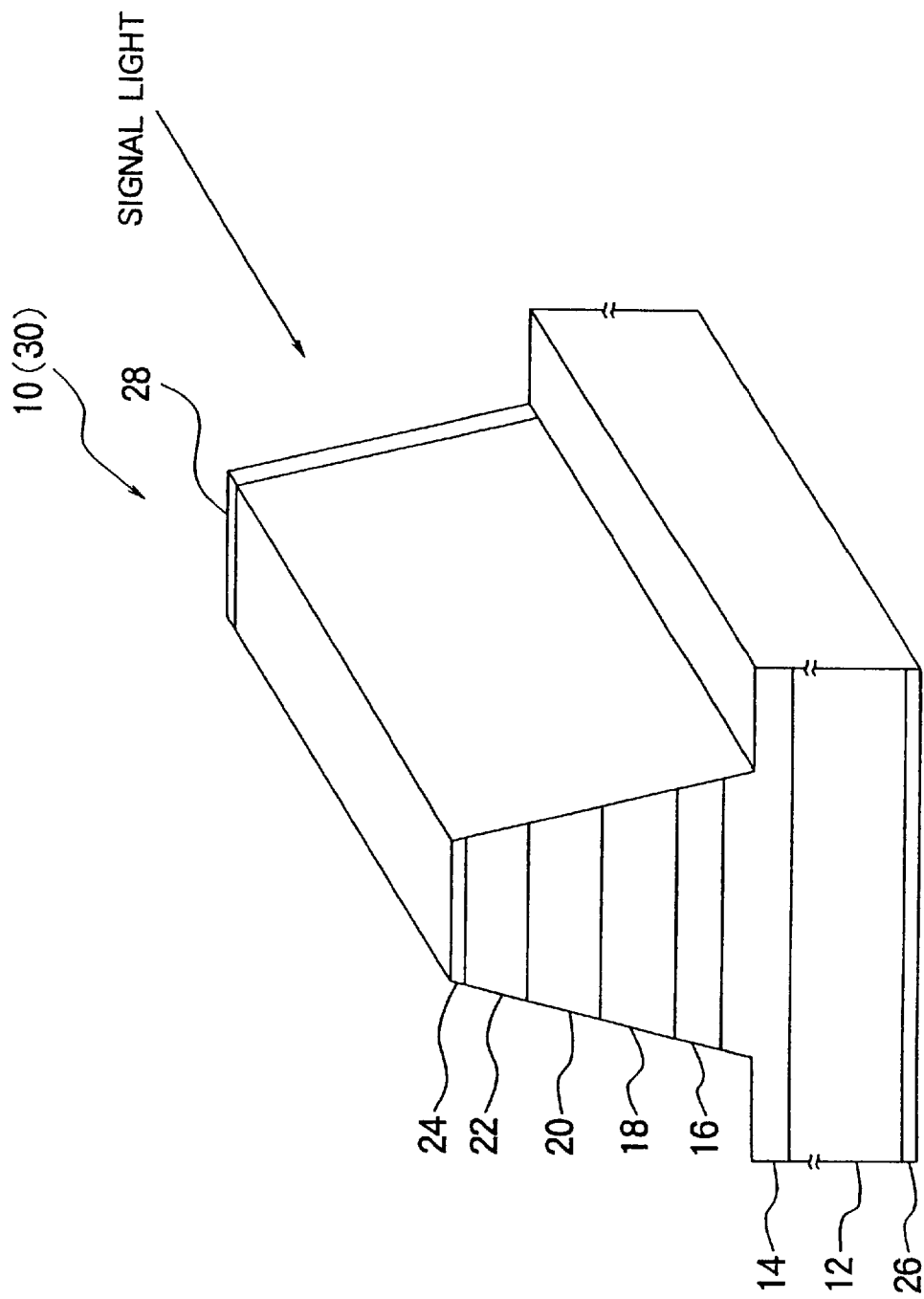
FIG. 3 is a perspective view of a waveguide type semiconductor photodetector according to first and second embodiments of the present invention.

Referring to FIG. 3 showing a waveguide type semiconductor photodetector according to first and second embodiments of the present invention, the photodetector has a function for selectively absorbing light having 1.3 $\mu$m wavelength, selectively from other light having other wavelength especially 1.5 μm wavelength.

The photodetector 10 of the first embodiment comprises an n-type InP substrate 12 having a carrier density of $5\times10^{18}\text{cm}^{-3}$ and a layer structure formed on the InP substrate 12. The layer structure includes a 3 μm-thick first optical confinement layer 14 made of n-type AlGaInAs having a carrier density of $1\times10^{18}\text{cm}^{-3}$ and a bandgap wavelength of 1.2 μm, a 0.4 μm-thick optical absorption layer 16 made of undoped AlGaInAs having a bandgap wavelength of 1.40 μm, a 3 μm-thick second optical confinement layer made of p-type AlGaInAs having a carrier density of $1\times10^{18}\text{cm}^{-3}$ and a bandgap wavelength of 1.2 μm, a 2 μm-thick cladding layer 20 made of p-type InP having a carrier density of $1\times10^{18}\text{cm}^{-3}$, a p-type GaInAs layer 22 having a carrier density of $2\times10^{19}\text{cm}^{-3}$ disposed consecutively as viewed from the InP substrate 12. The layer structure including the semiconductor layers and substrate as described above is epitaxially grown on the InP substrate 12 in lattice-matching therewith.

In manufacture of the photodetector of the first embodiment, after the layer structure is epitaxially grown on the InP substrate 12, the layer structure is selectively etched to form a ridge stripe. Then, a dielectric film is formed on the entire surface by a coating technique for passivation, followed by a selective etching thereof to expose the GaInAs substrate 22. Subsequently, Ti, Pt and Au are consecutively deposited on the exposed GaInAs substrate 22 by an evaporation technique, followed by patterning thereof to form a p-side electrode 24 of a 50 μ m×5 μm square in ohmic contact with the GaInAs substrate 22. An n-side electrode 26 is also deposited for ohmic contact with the back surface of the InP substrate 12 by an evaporation technique. Further, SiNx non-reflective film 28 is formed on the light incidence facet of the photodetector by an evaporation technique.

The photodetector of the present embodiment thus manufactured exhibited a photosensitivity of 0.9 A/W for light of 1.3 μm wavelength when coupled with a quartz glass fiber having a mode field diameter of 6 μm. It also exhibited a photosensitivity of 0.7 A/W when coupled with an optical fiber having a mode field diameter of 8 μm. As a result, the calculated coupling loss of the photodetector was approximately 85% for both the cases, proving an improved sensitivity of the photodetector of the present embodiment which is higher by approximately double or more compared to the case of a 1 μm-thick optical absorption layer made of GaInAs generally used in a conventional photodetector.

The improvement as mentioned above was obtained mainly by the larger mode field diameter and the larger tolerance for the axial deviation. Specifically, the optical absorption layer 16 has a thickness of 0.4 μm and a bandgap wavelength of 1.40 μm which is larger by 0.20 μm than the wavelength 1.20 μm of the first and second optical confinement layers 14 and 18, the difference of 0.20 μm in the bandgap wavelength providing the larger mode field. The larger horizontal tolerance is due to the optical confinement layers having a large thickness of 3 μm.

Second Embodiment

A photodetector according to a second embodiment has a configuration similar to that of the first embodiment except that the photodetector 30 of FIG. 3 according to the present invention comprises a first optical confinement layer 14 made of n-type GaInAsP having a bandgap wavelength of 1.45 μm, an optical absorption layer 16 made of undoped GaInAs having a bandgap wavelength of 1.65 μm, and a second optical confinement layer made of p-type GaInAsP having a wavelength of 1.45 μm. The other configurations including the carrier density of each layer, the structures of the electrodes and the material for the non-reflective film are similar to those of the first embodiment. The photodetector 30 of the present embodiment functions for receiving light having a 1.55 μm wavelength.

The photodetector of the present embodiment manufactured similarly to the process for the first embodiment exhibited a photosensitivity of 1.0 A/W for light having a 1.55 μm wavelength when coupled with a quartz glass fiber having a mode field diameter of 6 μm.

As a result, the calculated coupling loss of the photodetector was approximately 80%, proving an improved sensitivity of the photodetector of the present embodiment which is higher by approximately double or more compared to the case of a 1 μm-thick optical absorption layer made of GaInAs generally used in a conventional photodetector.

The improvement in the second embodiment as mentioned above was obtained mainly by the larger mode field diameter and the larger tolerance for axial deviation. Specifically, the optical absorption layer 16 has a thickness of 0.4 μm and a bandgap wavelength of 1.40 μm which is higher by 0.20 μm than the wavelength 1.20 μm of the first and second optical confinement layers 14 and 18, the difference of 0.20 μm in the wavelength providing the larger mode field. The larger tolerance is due to the optical confinement layers having a large thickness of 3 μm.

Figure 4:
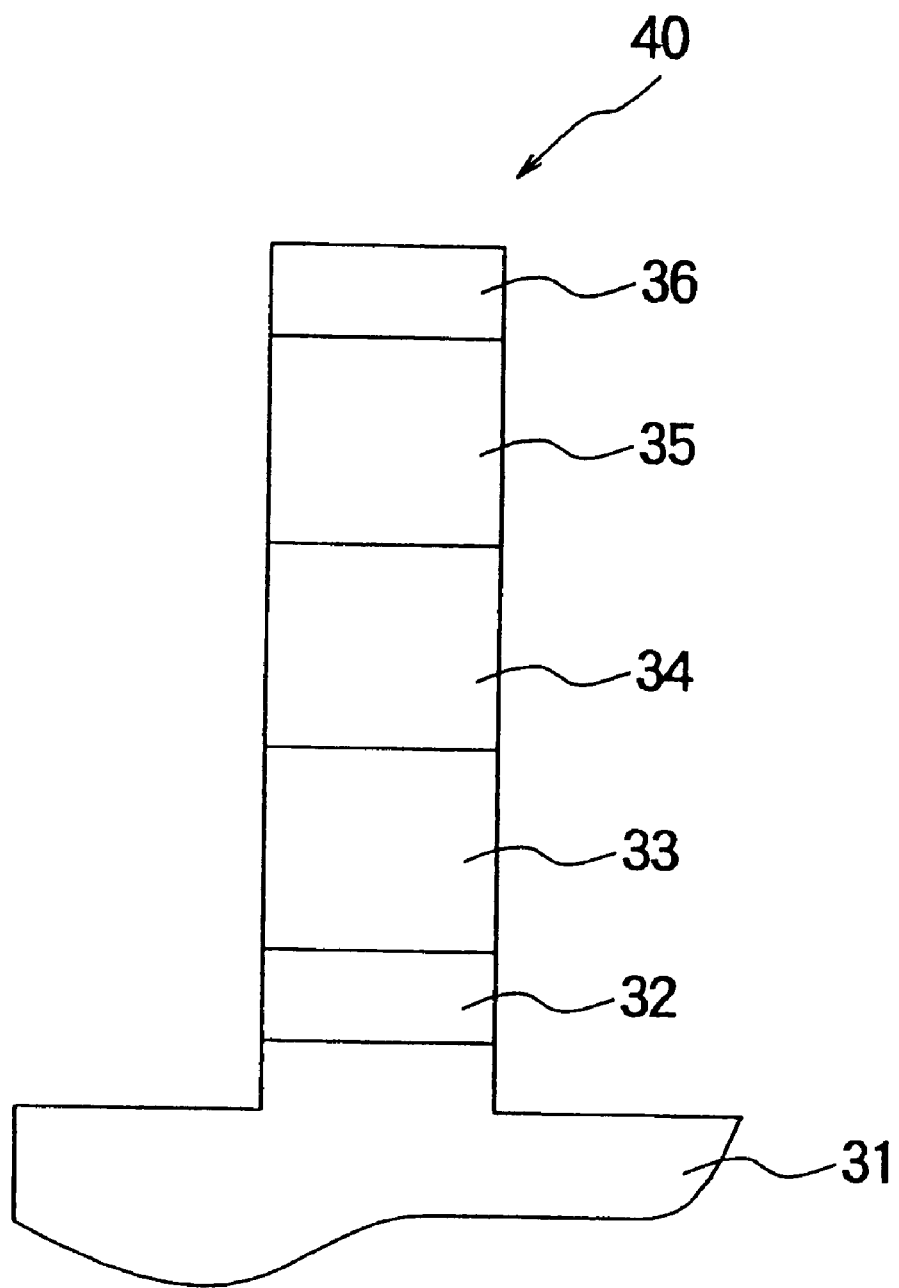
FIG. 4 is a cross-sectional view of a waveguide type semiconductor photodetector according to a third embodiment of the present invention.

FIG. 4 shows a waveguide type semiconductor photodetector according to a third embodiment of the present invention in a manufacturing step. The photodetector can be used for detecting light having a 1.3 μm wavelength. The ridge structure 40 for the photodetector of the present embodiment comprises an n-type InP substrate 31 having a carrier density of $5\times10^{18}\text{cm}^{-3}$, and a layer structure including a 0.5 μm-thick first optical confinement layer 32 made of n-type GaInAsP having a carrier density of $1\times10^{18}\text{cm}^{-3}$ and a bandgap wavelength of 1.1 μm, a 3 μm-thick optical absorption layer 33 made of undoped GaInAsP having a bandgap wavelength of 1.4 μm, a 2 μm-thick second optical confinement layer 34 made of p-type GaInAsP having a carrier density of $1\times10^{18}\text{cm}^{-3}$ and a bandgap wavelength of 1.1 μm, a 2 μm-thick cladding layer 35 made of InP having a carrier density of $1\times10^{18}\text{cm}^{-3}$, and a 0.3 μm-thick contact layer 36 made of p-type GaInAsP having a carrier density of $2\times10^{19}\text{cm}^{-3}$ which are consecutively formed on the InP substrate.

The photodetector of the present embodiment can be manufactured as follows. First, the first optical confinement layer 32, optical absorption layer 33, second optical confinement layer 34, cladding layer 35 and contact layer 36 are consecutively formed on the InP substrate 31. The laminate formed on the InP substrate 31 is selectively etched together with an upper portion of the InP substrate 31 to form a plurality of ridge stripes 40 shown in FIG. 4 and each having a width of 14 μm in the upper portion of the ridge structure.

Then, the ridge structures 40 are covered with a dielectric layer, in which a contact hole is formed to expose a portion of the contact layer 36 of each ridge stripe 40. A p-side electrode layer not shown in the figure is then formed on the exposed portions of the contact layer 36 by an evaporation technique. Subsequently, the wafer is cleaved to obtain flat facets at both ends of each ridge stripe 40, one of which is coated with non-reflective SiNx film by evaporation for forming a light incident facet. Finally, the wafer is cut to provide separate ridge stripes 40 for photodetectors.

The third embodiment thus manufactured exhibited a mode field diameter of 2.7 μm for the zero-th order mode, and could be excited up to the eighth order mode. The receiving center of the photodetector for incident light is shifted upward from the center of the optical absorption layer 33 by 0.1 μm.

The photodetector of the third embodiment was subjected to measurement of tolerance characteristic for axial deviation while it is coupled with a quartz glass fiber by a butting joint. The measured tolerance characteristic was such that the coupling loss was 0.5 dB at the axial deviation of ±3.0 μm deviated from an exact alignment providing a maximum coupling efficiency. The result was satisfactory for the case of mounting the photodetector on an optical semiconductor module. In addition, the photodetector exhibited a photosensitivity as high as 0.95 A/W for light having a 1.3 μm wavelength. The dark current measured in the photodetector was as low as 200 pA at a 3-volt reverse bias voltage.

The third embodiment comprises a layer structure having a thickness of 7.8 μm, whereas the corresponding layer structure in the conventional waveguide type photodetector has a thickness of 9 μm or higher. By the smaller thickness by 1.2 μm in the layer structure of the present embodiment compared to the conventional photodetector reduces the processing time of the epitaxial process for the layer structure, which is a significant improvement for the throughput of the photodetector in a practical process.

If it is desired that the photodetector of the present embodiment be mounted by a junction-down technique, the receiving center of the optical absorption layer may be controlled by adjusting the thickness of the cladding layer 35 in FIG. 4.

InP of the cladding layer 20 or 35 in the above embodiments may be replaced by GaInAsp, AlGaInAs etc. to obtain a similar function. In addition, the structure of the present invention can be applied not only to a waveguide type photodetector but also to another type of photodetector which may be integrated with an optical modulator, semiconductor laser or other optical devices. Further, the present invention can be also applied to an optical modulator for a less coupling loss.

What is claimed is:

1. A waveguide type semiconductor photodetector comprising a semiconductor substrate, and a first semiconductor layer of a first conductivity type, an undoped second semiconductor layer and a third semiconductor layer of a second conductivity type opposite to said first conductivity type consecutively formed on said semiconductor substrate, said second semiconductor layer having a thickness between 0.2 μm and 0.5 μm and having a bandgap energy lower than bandgap energies of said first and third semiconductor layers, wherein both a difference between bandgap wavelengths of said first and second semiconductor layers and a difference between bandgap wavelengths of said second and third semiconductor layers are not higher than 0.3 μm.

2. A waveguide type semiconductor photodetector comprising a semiconductor substrate, and a first semiconductor layer of a first conductivity type, an undoped second semiconductor layer and a third semiconductor layer of a second conductivity type opposite to said first conductivity type consecutively formed on said semiconductor substrate, said first semiconductor layer having a thickness between 0.05 μm and 1 μm, said third semiconductor layer having a thickness not lower than 1 μm.

3. A waveguide type semiconductor photodetector as defined in claim 2 wherein at least second and third semiconductor layers are formed as a ridge stripe having a width of not lower than 10 μm.

\* \* \* \* \*